(12) United States Patent
Chakrabartty

(10) Patent No.: US 7,479,911 B2
(45) Date of Patent: Jan. 20, 2009

(54) MULTIPLE INPUT MULTIPLE OUTPUT ANALOG-TO-DIGITAL CONVERTER

(75) Inventor: Shantanu Chakrabartty, Williamston, MI (US)

(73) Assignee: Board of Trustees of Michigan State University, East Lansing, MI (US)

(*) Notice: Subject to any disclaimer, the term of this patent is extended or adjusted under 35 U.S.C. 154(b) by 0 days.

(21) Appl. No.: 11/895,630

(22) Filed: Aug. 24, 2007

(65) Prior Publication Data

US 2008/0055133 A1   Mar. 6, 2008

Related U.S. Application Data

(60) Provisional application No. 60/840,054, filed on Aug. 24, 2006.

(51) Int. Cl.
*H03M 3/00* (2006.01)

(52) U.S. Cl. ...................................... 341/143; 341/155

(58) Field of Classification Search .......... 341/143–155
See application file for complete search history.

(56) References Cited

U.S. PATENT DOCUMENTS

| | | | |
|---|---|---|---|
| 4,876,542 A * | 10/1989 | van Bavel et al. | 341/143 |
| 6,496,128 B2 * | 12/2002 | Wiesbauer et al. | 341/143 |
| 6,987,953 B2 * | 1/2006 | Morris et al. | 455/102 |
| 7,113,120 B1 * | 9/2006 | Dolazza et al. | 341/143 |
| 7,136,430 B2 * | 11/2006 | Morris et al. | 375/316 |

* cited by examiner

*Primary Examiner*—Lam T Mai
(74) *Attorney, Agent, or Firm*—Harnes, Dickey & Pierce, P.L.C.

(57) ABSTRACT

A method is provided for multi-channel analog-to-digital conversion. The method includes: receiving an input vector which represents a plurality of analog signals; transforming the input vector using a linear transformation matrix; converting the transformed input vector to a digital stream using an array of sigma-delta converter; and adapting the linear transform matrix to maximize de-correlation between the signals represented in the input vector.

15 Claims, 23 Drawing Sheets

MULTIPLE INPUT MULTIPLE OUTPUT ANALOG-TO-DIGITAL CONVERTER

CROSS-REFERENCE TO RELATED APPLICATIONS

This application claims the benefit of U.S. Provisional Application No. 60/840,054, filed on Aug. 24, 2006. The disclosure(s) of the above application(s) is (are) incorporated herein by reference.

FIELD

The present disclosure relates to multi-channel analog-to-digital conversion.

BACKGROUND

Design of cortically implanted neural prosthetic sensors (CINPS) is an active area of research in the rapidly emerging field of brain machine interfaces (BMI). The core technology of these sensors is micro-electrode arrays that facilitate real-time recording from thousands of neurons simultaneously. These recordings are then actively processed at the sensor and transmitted to an off-scalp neural processor which controls the movement of a prosthetic limb. A key challenge in designing implantable integrated circuits (IC) for CINPS is to efficiently process high-dimensional signals generated at the interface of micro-electrode arrays. Sensor arrays consisting of more than 1000 recording elements are common which significantly increase the transmission rate at the sensor. A simple strategy of recording, parallel data conversion and transmitting the recorded neural signals (at a sampling rate of 10 KHz) can easily exceed the power dissipation limit of 80 mW/cm$^2$ determined by local heating of biological tissue. In addition to increased power dissipation, high-transmission rate also adversely affects the real-time control of neural prosthesis.

One of the solutions that have been proposed by several researchers is to perform compression of the neural signals directly at the sensor, to reduce its wireless transmission rate and hence its power dissipation. Currently most compression strategies are performed subsequent to an analog-to-digital conversion stage. This disclosure presents an approach where de-correlation or redundancy elimination is performed directly at analog-to-digital converter. It has been shown that neural cross-talk and common-mode effects introduce unwanted redundancy at the output of the electrode array. As a result neural signals typically occupy only a small sub-space of the high-dimensional space spanned by the micro-electrode signals. An optimal strategy for designing a multi-channel analog-to-digital converter is to identify and operate within the subspace spanned by the neural signals and in the process eliminate cross-channel redundancy and perform spatial compression. To achieve this goal, this disclosure proposes to use large margin principles, which have been highly successful in high-dimensional information processing. This approach will be to formalize a cost function consisting of $L_1$ norm of the internal state vector whose gradient updates naturally lends to a digital time-series expansion. Within this framework the correlation distance between the channels will be minimized which amounts to searching for signal spaces that are maximally separated from each other. The architecture called multiple-input multiple-output (MIMO) sigma-delta ($\Sigma\Delta$) converter is the first reported data conversion technique to embed large margin principles. The approach, however, is generic and can be extended to designing higher order analog-to-digital converters. The statements in this section merely provide background information related to the present disclosure and may not constitute prior art.

SUMMARY

A method is provided for multi-channel analog-to-digital conversion. The method includes: receiving an input vector which represents a plurality of analog signals; transforming the input vector using a linear transformation matrix; converting the transformed input vector to a digital stream using an array of sigma-delta converter; and adapting the linear transform matrix to maximize separation between the signals represented in the input vector.

Further areas of applicability will become apparent from the description provided herein. It should be understood that the description and specific examples are intended for purposes of illustration only and are not intended to limit the scope of the present disclosure.

DRAWINGS

FIG. 1 an exemplary architecture of a proposed first-order MIMO $\Sigma\Delta$ type converter;

Figure 1:
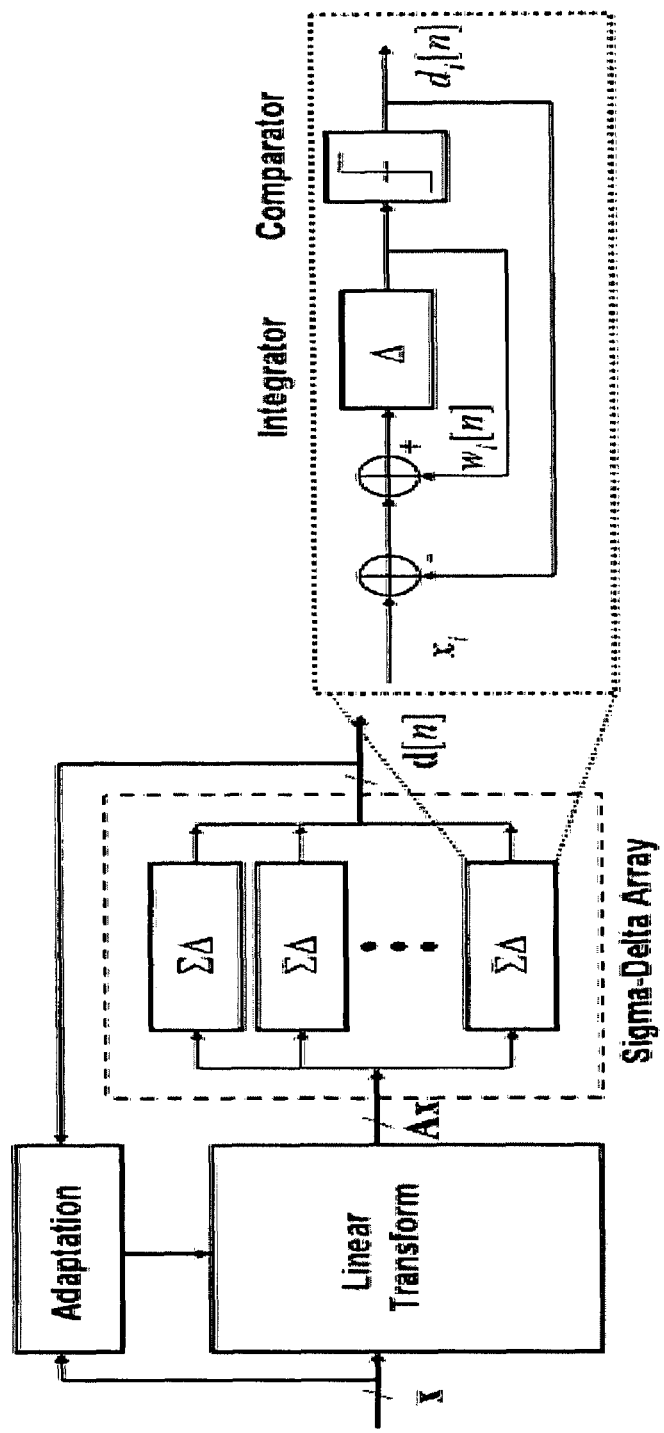

The drawings described herein are for illustration purposes only and are not intended to limit the scope of the present disclosure in any way.

DETAILED DESCRIPTION

An optimization framework is introduced for deriving a multiple-input multiple-output (MIMO) sigma-delta ($\Sigma\Delta$) converter. For the sake of simplicity, we will first assume that the input to converter is a M dimensional vector $x \in R^M$ where each dimension represents a single channel in the multi-electrode array. It is also assumed that the vector x is stationary with respect to discrete time instances n. The validity and limitation of this assumption is explained briefly at the end of this section. Also denote a linear transformation matrix $A \in R^{M \times M}$ and a regression weight vector $w \in R^M$. Consider the following optimization problem $$\min_{w} f(w, A) \text{ where} \tag{1}$$

$$f(w, A) = |w|^T 1 - w^T A x \tag{2}$$

and 1 represents a column vector whose elements are unity. The cost function in equation 2 consists of two factors: the first factor is an $L_1$ regularizer which constrains the norm of the vector w and the second factor that maximizes the correlation between vector w and an input vector x transformed using a linear projection denoted by matrix A. The choice of $L_1$ norm and the form of cost function in equation (2) will become clear when we present its corresponding gradient update rule. To ensure that the optimization problem in equation 1 is well defined, the norm of the input vector $\|x\|_\infty \leq 1$ will be assumed to be bounded. Even the cost function in equation (2) uses a linear function $A^T x$, the formulation can also use non-linear bounded functions.

The closed form solution to optimization problem in equation 1 can be found to be w*=0. From the perspective of A/D conversion we will show that the iterative steps leading towards solution to the optimization problem in equation 1 are more important than the final solution itself. Given an initial estimate of the state vector w[0] the online gradient descent step for minimizing 1 at iteration n is given by $$w[n] = w[n-1] - \eta \frac{\partial f}{\partial w} \tag{3}$$

where $\eta > 0$ is defined as the learning rate. The choice of $L_1$ norm in optimization function in equation 1 ensures that for $\eta > 0$ the iteration in equation 3 exhibits oscillatory behavior around the solution w*. Combining equation (3) with equation (2) the following recursion is obtained:

$$w[n] = w[n-1] + \eta(Ax - d[n]) \tag{4}$$

where $$d[n] = sgn(w[n-1]) \tag{5}$$

and sgn(u) denotes an element-wise signum operation such that $d[n] \in \{+1, -1\}^M$ represents a digital time-series. The iterations in equation 3 represents the recursion step for M first-order $\Sigma\Delta$ converters coupled together by the linear transform A. If we assume that the norm of matrix $\|A\|_\infty \leq 1$ is bounded, it can be shown that $\|w_\infty\| < 1 + \eta$ Following N update steps the recursion given by equation 4 yields $$Ax - \frac{1}{N}\sum_{n=1}^{N} d[n] = \frac{1}{\eta N}(w[N] - w[0]) \tag{6}$$

which using the bounded property of w asymptotically leads to $$\frac{1}{N}\sum_{n=1}^{N} d[n] \to Ax \tag{7}$$

$N \to \infty$.

Therefore consistent with the theory of $\Sigma\Delta$ conversion the moving average of vector digital sequence d[n] converges to the transformed input vector Ax as the number of update steps N increases. It can also be shown that N update steps yields a digital representation which is $\log_2(N)$ bits accurate.

The next step is to determine the form of the matrix A which denotes the family of linear trans-formations spanning the signal space. The aim of optimizing for A is find multi-channel signal configuration that is maximally separated from each other. For this purpose we denote one channel or dimension as a reference dimension relative to which all distances/correlations will be measured. This is unlike the scenario for independent component analysis (ICA) where the objective is search for maximally independent signal space includes the reference channel. Even though several forms of the matrix $A=[a_{ij}]$ can be chosen for reason which will discussed later in this paper, the matrix A is chosen to be a lower triangular matrix such that $a_{ij}=0$; i<j and $a_{ij}=1$; i=j. Thus the first channel is unaffected by the proposed transform A and will be the reference channel. Also lower triangular form ensures unconditional stability for the proposed architecture.

The problem of compression or redundancy elimination is therefore to optimize the cross-elements $a_{ij}$ such that the cross-correlation terms in optimization function given by equation 1 are minimized. This can be written as a min-max optimization criterion where an inner optimization performs analog-to-digital conversion, where as the outer loop adapts the linear transform matrix A such as to maximize the margin of separation between the respective signal space. This can be denoted by the following equation:

$$\max_{a_{ij} i \neq j} \left( \min_{w} f(w, A) \right) \tag{8}$$

In conjunction with the gradient descent steps in equation 4 the update rule for elements of A follows a gradient ascent step given by $$a_{ij}[n] = a_{ij}[n-1] - \epsilon w_i[n] x_j; \forall i < j \tag{9}$$

where $\epsilon$ is a learning rate parameter. The update rule in equation 9 can be made amenable to hardware implementation by considering only the sign of the regression vector w[n] and the input vector x as $$a_{ij}[n] = a_{ij}[n-1] - \epsilon d_i[n]\text{sign}(x_j); \forall i<j \quad (10)$$

The update rule in equation (10) bears strong resemblance to online update rules used in independent component analysis (ICA). The difference with the proposed technique however is the integrated data conversion coupled with spatial decorrelation/compression. The output of the MIMO ΣΔ converter is a digital stream whose pulse density is proportional to the transformed input data vector as $$\frac{1}{N}\sum_{n=1}^{N} d[n] \longrightarrow A[n]x \quad (11)$$

By construction the MIMO converter produces a digital stream whose pulse-density contains only non-redundant information. To achieve compression some of the digital channels can be discarded (based on their relative energy criterion) and can also be shut down to conserve power. The original signal can be reconstructed from the compressed digital stream by applying an inverse transformation $A^{-1}$ as $$\hat{x} = \frac{1}{N} A[n]^{-1} \left( \sum_{n=1}^{N} d[n] \right). \quad (12)$$

An advantage of using a lower triangular form for the linear transformation matrix A with its diagonal elements as unity, is that its inverse is always well-defined. Thus signal reconstruction using the output of the analog-to-digital converter is also always well defined. Since the transformation matrix A is continually being updated, the information related to the linear transform also needs to be periodically transmitted to ensure faithful reconstruction at the neural controller. However, analogous to many naturally occurring signal the underlying statistics of multi-dimensional signal changes slowly as the signal itself. Therefore the transmission of the matrix A needs to be performed at a relatively slower rate than the transmission rate of the neural signals.

Similar to conventional ΣΔ conversion, the framework for MIMO ΣΔ can be extended to time-varying input vector under the assumption of high oversampling criterion. For a MIMO A/D converter, oversampling ratio (OSR) is defined by the ratio of the update frequency $f_s$ and the maximum Nyquist rate amongst all elements of the input vector x[n]. The resolution of the MIMO ΣΔ is also determined by the OSR as $\log_2(OSR)$ and during the oversampling period the input signal vector can be assumed to be approximately stationary. For time-varying input vector $x[n]=\{x_j[n]\}$, j=1, ..., M the matrix update equation in equation 10 can be generalized after N steps as $$\frac{1}{N} a_{ij}[N] = \varepsilon \frac{1}{N} \sum_{n=1}^{N} d_i[n]\text{sgn}(x_j[n]); \forall i > j \quad (13)$$

Thus if the norm of the matrix A is bounded, then under asymptotic condition N→∞ the equation 13 implies decrease in cross-channel correlation between the digital output and the sign of the input signal. This is similar to de-correlation framework in ICA where higher-order correlations are generated using non-linear mapping of random variables.

FIG. 1 depicts an exemplary architecture for a MIMO ΣΔ converter illustrating recursions (4) and (11). As shown in FIG. 1, the regression vectors w[n] within the framework of MIMO ΣΔ represents the output of the ΣΔ integrator. All the adaptation and linear transformation steps can be implemented using analog VLSI with adaptation steps implemented either using multiplying digital-to-analog converters or floating gates synapses. Even though any channel can be chosen as a reference channel, experiments indicate that the channel with maximum cross-correlation and maximum signal power serves as the best choice.

Figure 2:
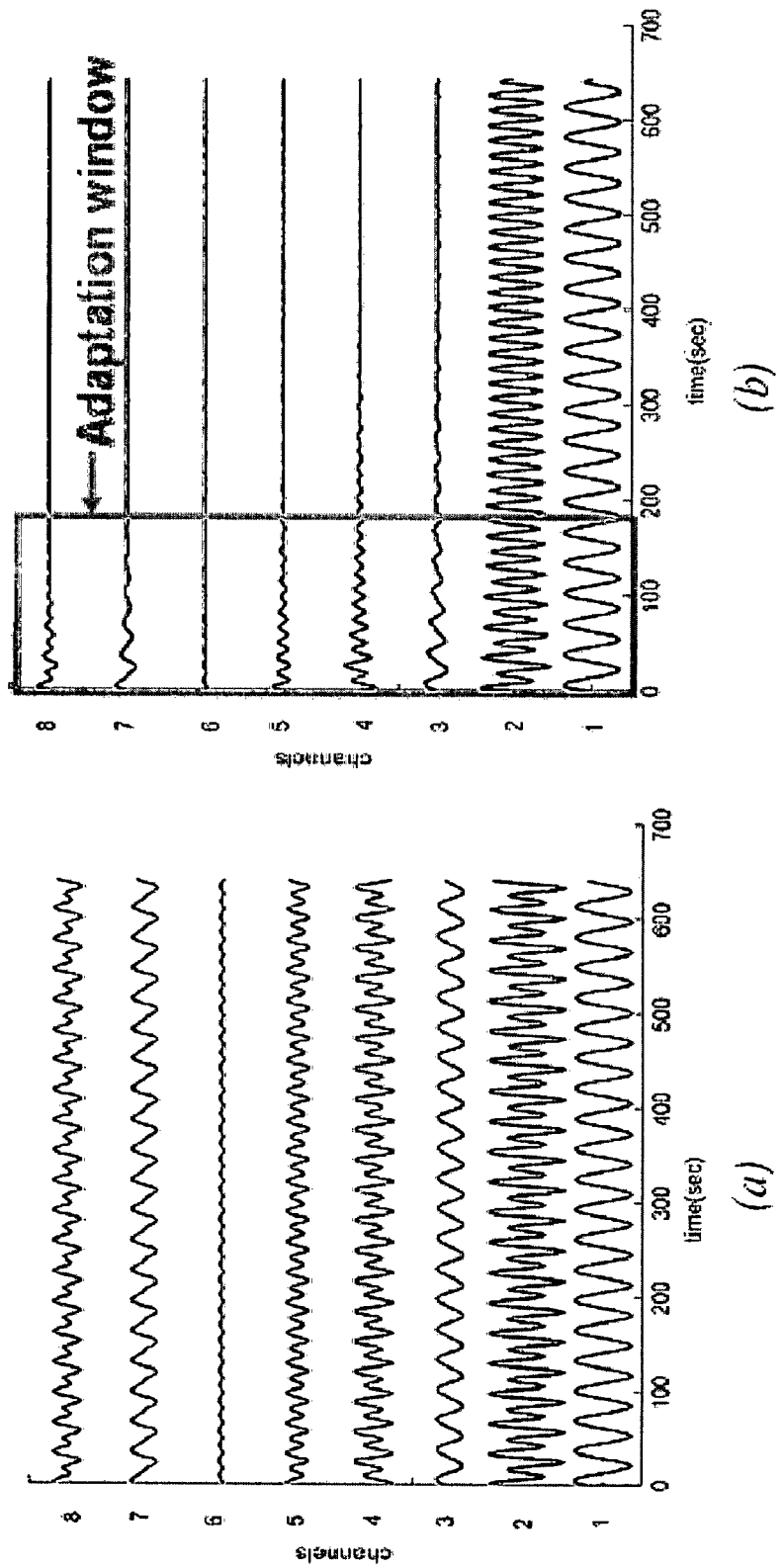
FIGS. 2A and 2B are graphs illustrating the functional verification of MIMO $\Sigma\Delta$ converter on artificially generated multi-channel data: data presented to the MIMO $\Sigma\Delta$ converter and analog representation of digital output produced by the MIMO converter, respectively.
Figure 3:
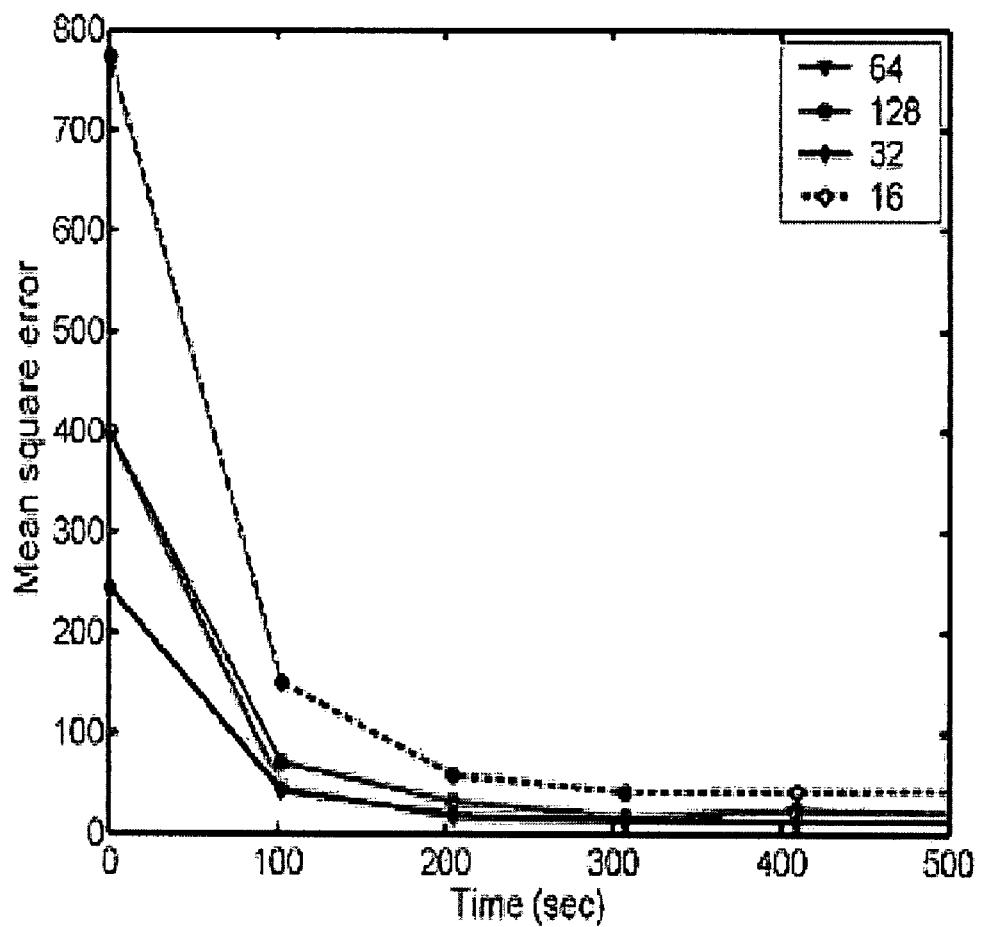
FIG. 3 is a graph of a reconstruction performance in terms of mean square error computed using artificial data for different OSR.

The functionality of the proposed MIMO sigma-delta converter was verified using artificially generated data and with real multi-channel recorded neural data. The first set of experiments simulated an artificially generated 8 channel data. FIG. 2A illustrates the multi-channel data where each channel was obtained by random linear mixing of two sinusoids with frequency 20 Hz and 40 Hz. The multi-channel data was presented to a MIMO sigma delta converter implemented in software. The equivalent analog representation of the pulse density encoded digital stream was obtained using a moving window averaging technique with window size equal to the oversampling ratio (OSR). The resultant analog representation of the ADC output is shown in 2B. It can be seen in the figure that after initial adaptation steps the output corresponding to first two channels converges to the fundamental sinusoids, where as the rest of the digital streams converged to an equivalent zero output. This simple experiment demonstrates the functionality of MIMO sigma-delta in eliminating cross-channel redundancy. The first two digital streams were used to reconstruct the original recording using equation 12. FIG. 3 shows the reconstruction error averaged over a time window of 2048 samples showing that the error indeed converges to zero, as the MIMO converter adapts. The FIG. 3 also shows the error curves for different OSR. It can be seen that even though better reconstruction error can be achieved by using higher OSR, the adaptation procedure compensates for errors introduced due to low resolution. In fact the reconstruction performance is optimal for intermediate OSR.

Figure 4:
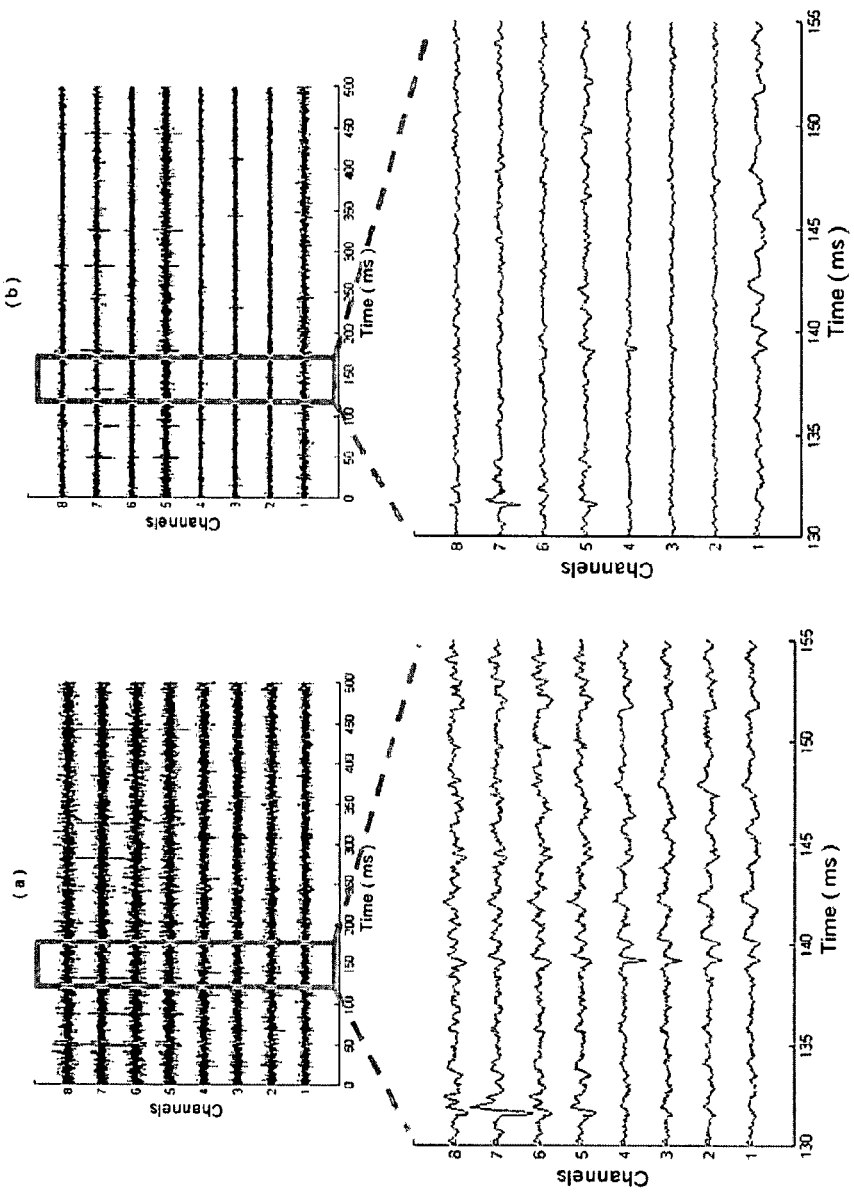
FIGS. 4A and 4B are graphs illustrating the functional verification of the MIMO sigma-delta converter for multi-channel neural data: original multichannel data and analog representation of digital output produced by the converter, respectively.
Figure 5:
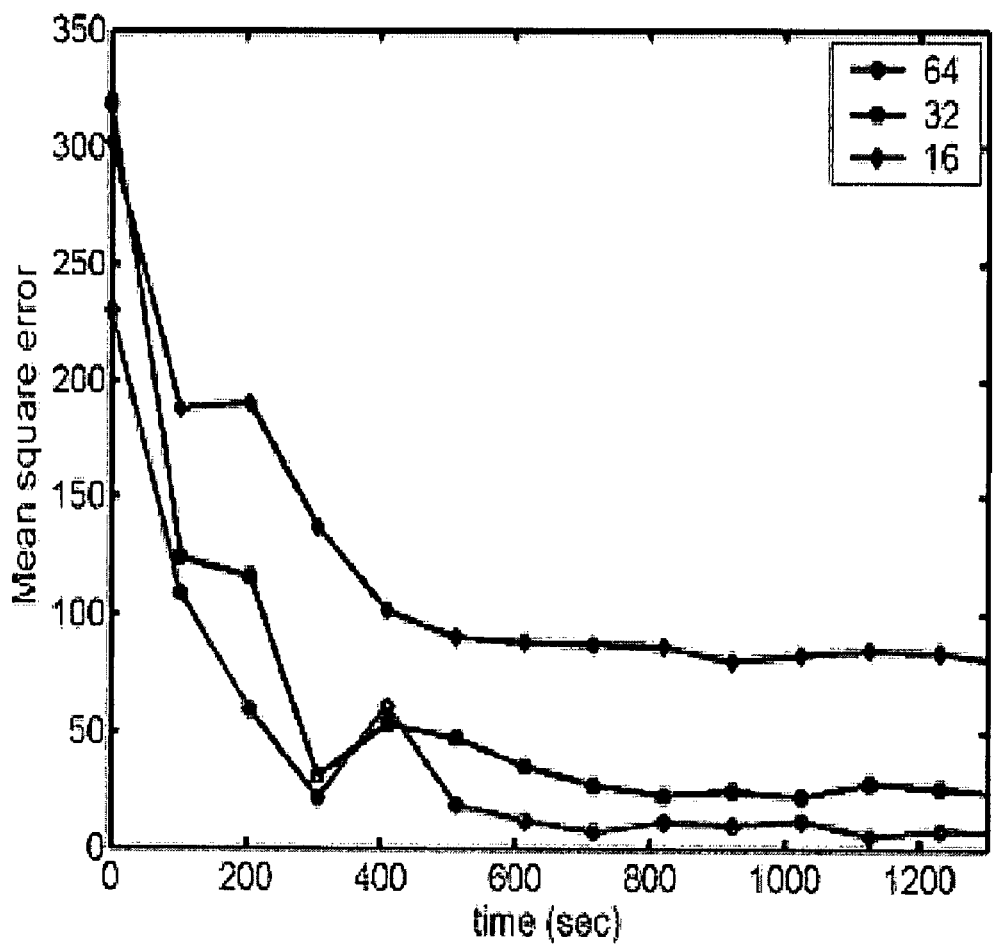
FIG. 5 is graph of a reconstruction performance in terms of mean square error computer using neural data for different OSR.

The multi-channel experiments were repeated with an eight channel neural data recorded from dorsal cochlear nucleus of adult guinea pigs. The data was recorded at a sampling rate of 20 KHz and at a resolution of 16 bits. FIG. 4A shows a clip of multi-channel recording for duration of 0.5 seconds. It can be seen from highlighted portion of FIG. 4A that the data exhibits high degree of cross-channel correlation. Similar to the first set of experiments the MIMO converter eliminates spatial redundancy between channels as shown by the analog representation of the reconstructed output in FIG. 4B. An interesting observation in this experiment is that even though the statistics of the input signals were varying in time as shown in FIGS. 4A and 4B, the transformation matrix A remains relatively stationary during the duration of the conversion, which is illustrated through the reconstruction error graph in FIG. 5. This validates the principle of operation of the MIMO conversion where the multi-channel neural recording lie on a low-dimensional manifold whose parameters are relatively stationary with respect to the signal statistics.

Figure 6:
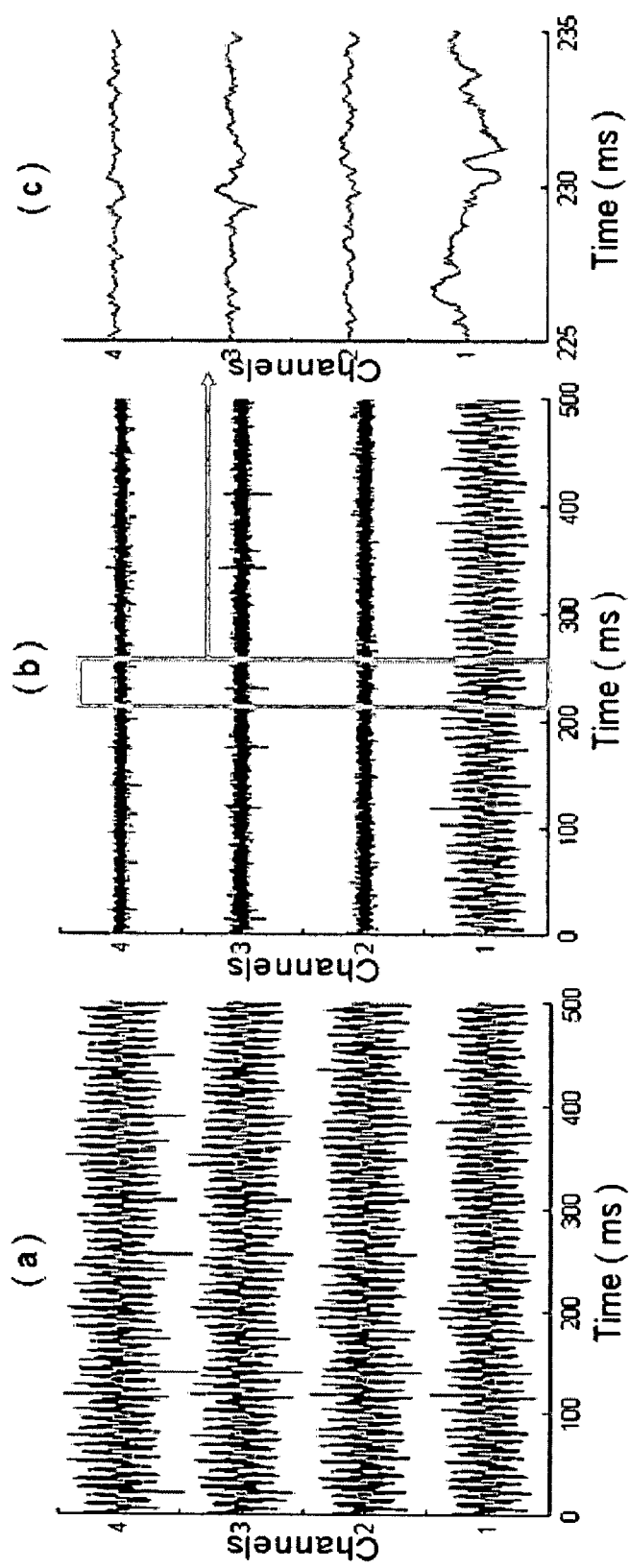
FIGS. 6A-6C are graphs demonstrating common-mode rejection performed by MIMO $\Sigma\Delta$: original multi-channel signal at the input of converter, analog representation of the converter output, and a magnified clip of the output produced by the converter illustrating preservation of neural information, respectively.

Another set of experiments demonstrate the ability of the proposed MIMO converter to reject common mode disturbance across all the channels. Rejection of common-mode signal is one of the most important requirement for processing neural signals whose amplitude range from 50 μV-500 μV, where as the common-mode interference resulting from EMG or electrical coupling could be as high as 10 mV. Therefore most of the micro-electrode arrays use bio-potential amplifiers for enhancing signal-to-noise ratio and common-mode rejection. For this set of experiments, the recorded neural data obtained from the previous experiment was contaminated by an additive 60 Hz sinusoidal interference of amplitude 1 mV. The results are shown in FIG. 6 illustrating that the reference channel absorbs all common-mode disturbance where as the neural information is preserved in other channels. In fact theoretically it can be shown that the common-mode rejection ratio for the proposed MIMO ADC is dependent only on the OSR and is given by $20 \log_{10} \text{OSR}$.

Figure 7:
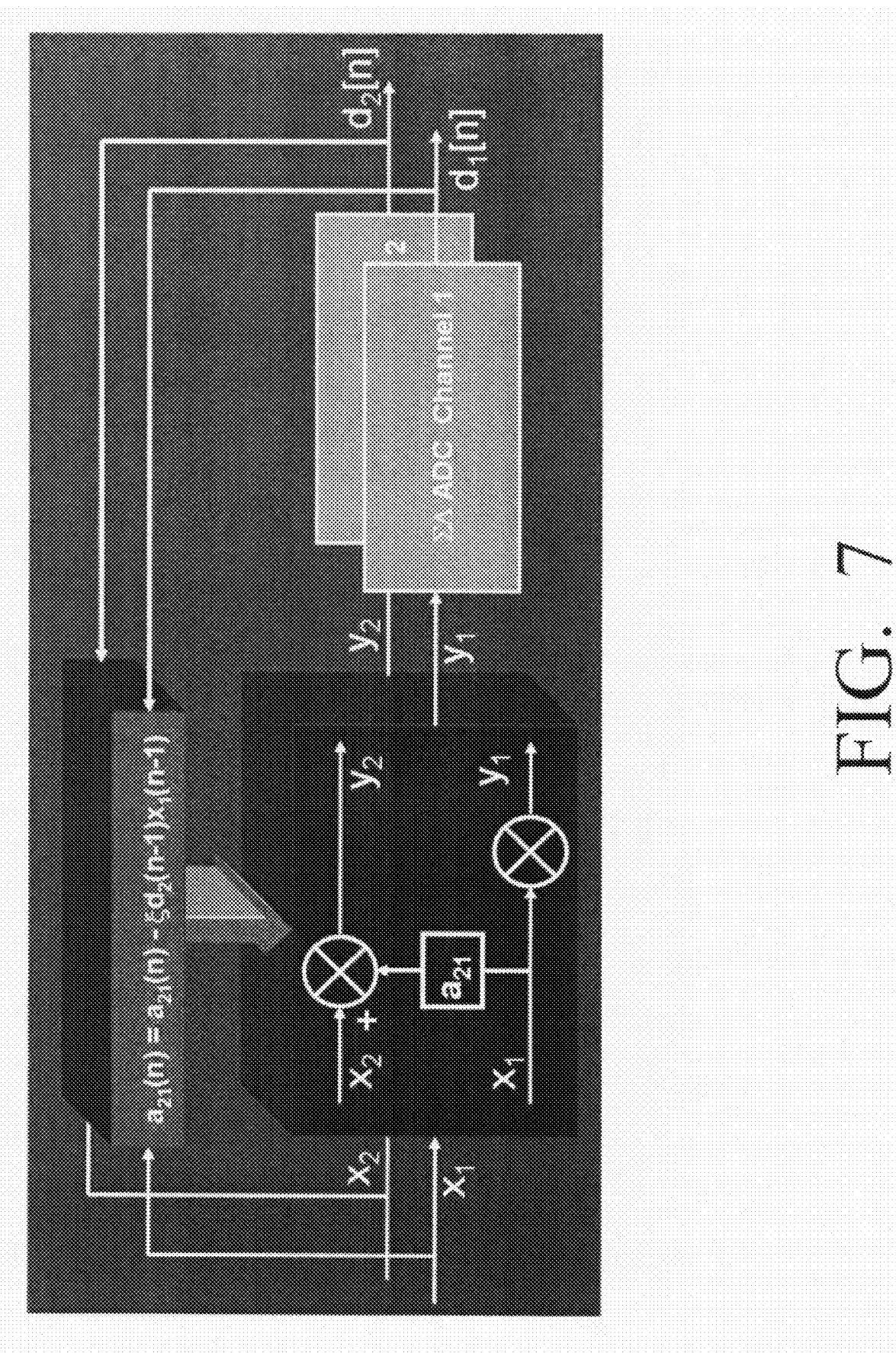
FIG. 7 is a block diagram of an algorithmic model of an exemplary 2×2 MIMO network.
Figure 8:
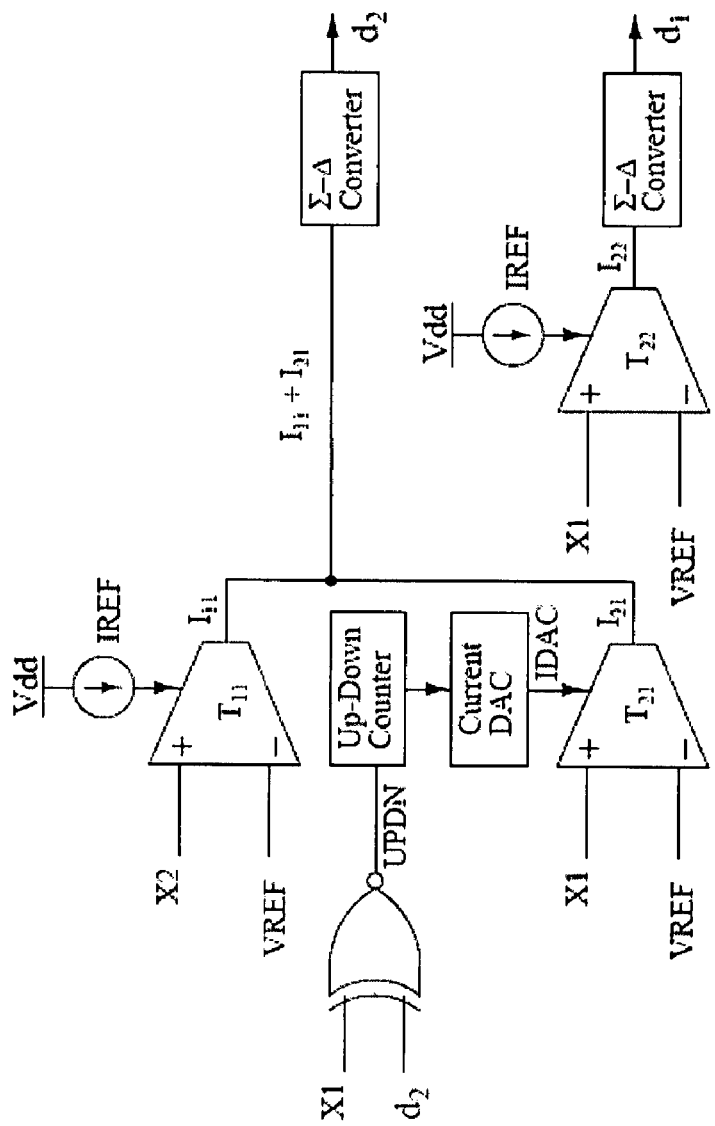
FIG. 8 is a schematic of an exemplary 2×2 MIMO analog-to-digital converter.

An exemplary circuit level implementation for a MIMO $\Sigma\Delta$ converter is discussed below. An algorithmic model of 2×2 MIMO network that implements synergistic steps (including equations 4 and 10 above) is shown in FIG. 7. The linear transform matrix A is a 2-dimensional lower triangular matrix that has non diagonal element $a_{21}$. Signal de-correlation is performed with the help of non diagonal element $a_{21}$. The adaptation unit implements equation 10. The algorithmic system is implemented in circuits with the help of transconductor network as shown in FIG. 8. The diagonal elements of signal transformation matrix A are transconductors with constant reference current IREF. The non diagonal elements are transconductors whose reference currents are varied based on signal correlation. While a two-dimensional converter is discussed below, it is readily understood that higher dimension converters are within the scope of this disclosure.

In an exemplary embodiment, a transconductance network has been used for implementing a matrix-vector-multiplier where additions are performed using Kirchoff's current law, and multiplications are performed by modulating the transconductance bias current. An implementation of a 2×2 (2-inputs, 2-outputs) MIMO analog-to-digital converter is shown in FIG. 8 where the transconductors $T_{ij}$ correspond to the element of the matrix A. Since all diagonal elements of the lower-triangular matrix A are constant, the transconductors $T_{ii}$ are biased by constant reference current IREF. The non-diagonal transconductor $T_{ij}$, $i \neq j$ are biased by a digitally programmable current-DAC. The output of a transconductor is therefore linearly proportional to the input vector $x_i$ and a digital parameter that drives the current DAC. The outputs of transconductors are connected along each column, where the summed current is presented as inputs to a $\Sigma\Delta$ converter array. Other implementations for the matrix-vector-multiplier are contemplated by this disclosure.

Figure 9:
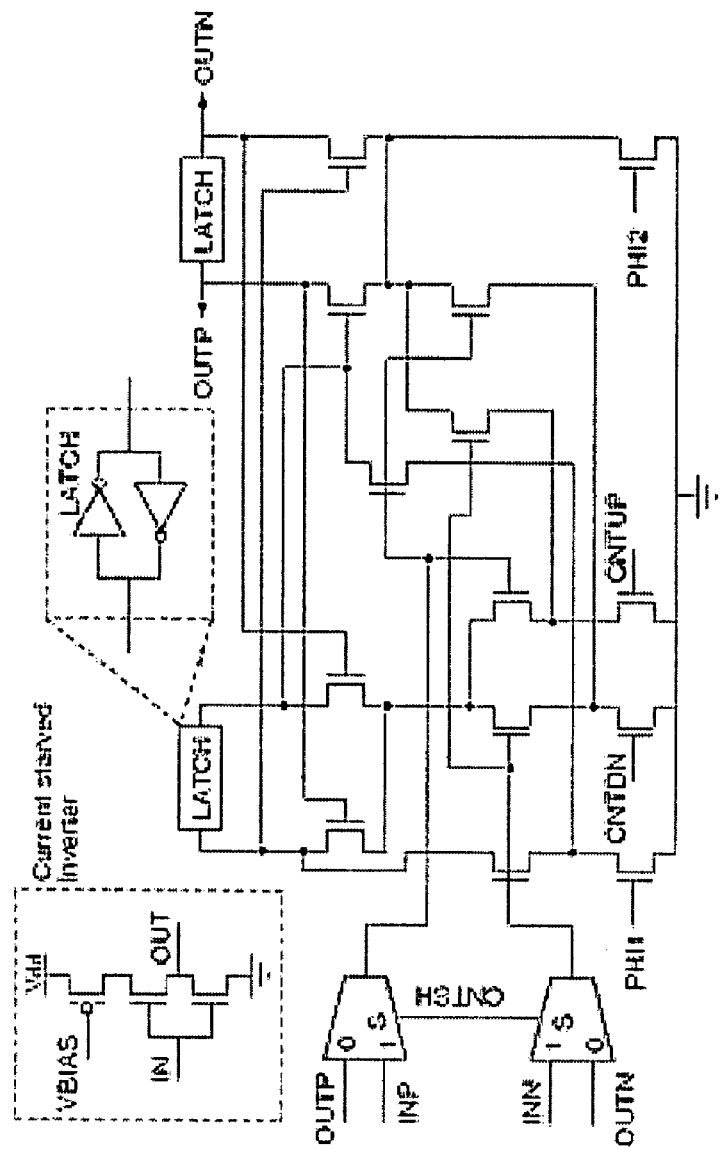
FIG. 9 is a schematic of a 1-bit up-down counter.

The $\Sigma\Delta$ converter used in a MIMO system is shown to have a 10-bit accuracy. The accuracy of $\Sigma\Delta$ converter decides the minimum requirements of the DAC structures used in the MIMO system. To avoid saturation of DAC currents, DAC needs to have a resolution 10-bit. With higher order of $\Sigma\Delta$ converter, the required resolution of a current DAC increases. The output current of current mode DACs is controlled by adoption unit. In the given 2 dimensional MIMO system, the adaptation of non-diagonal elements $a_{ij}$ is based on equation 10 and is implemented using an incremental/decremental counter. The mode (incremental/decremental) of the counter is triggered by a XNOR function computed between sign of the input signal $x_j[n]$ and the digital output of the $\Sigma\Delta$ converter $d_i$. The schematic of a single stage of the incremental/decremental counter is shown in FIG. 9. The circuit can also be configured as a serial shift register, therefore it is used to access the internal states of the counter for signal reconstruction. Current starved latches are used for each bit to have a better control over power-frequency operation. Signed operation is achieved by controlling the direction of the transconductor current using the counter MSB (see FIG. 11). The operation of the counter circuit is based on the architecture which was reported in an article entitled "A fully electronic DNA sensor with 128 positions and in-pixel A/D conversion" by M. Schienle et al. Solid-State Circuits, IEEE Journal of Volume 39, Issue 12, December 2004. The present implementation has been augmented to integrate decrement functionality at the expense of few extra transistors. A single stage of the counter consists of two current starved latches and an NMOS network that implements the counter/shifter logic. In the count mode, two latches are connected in a cross-coupled configuration based on the digital signals CNTUP or CNTDN that is used to increment or decrement the counter. In the count mode, the signals $\phi_1$ and $\phi_2$. Multiple stages of the counter can be cascaded to create boundary scan shift-registers that are used for accessing the internal variables $a_{ij}$ and for system debug functions.

Figure 10:
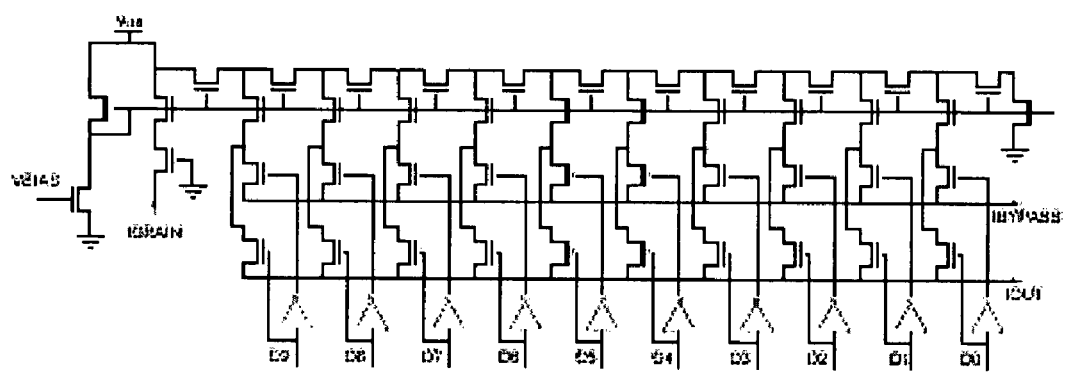
FIG. 10 is a schematic of a binary 8-bit current mode digital-to-analog counter.

The incremental/decremental counter also serves as a digital storage for the matrix element $a_{ij}$ and drives the input of a current-DAC. The schematic of a 10-bit current DAC is shown in FIG. 10 whose output determines the bias current of the transconductor. The current-DAC circuit is based on a standard MOS resistive network whose functionality has been demonstrated over several orders of magnitude.

Figure 11:
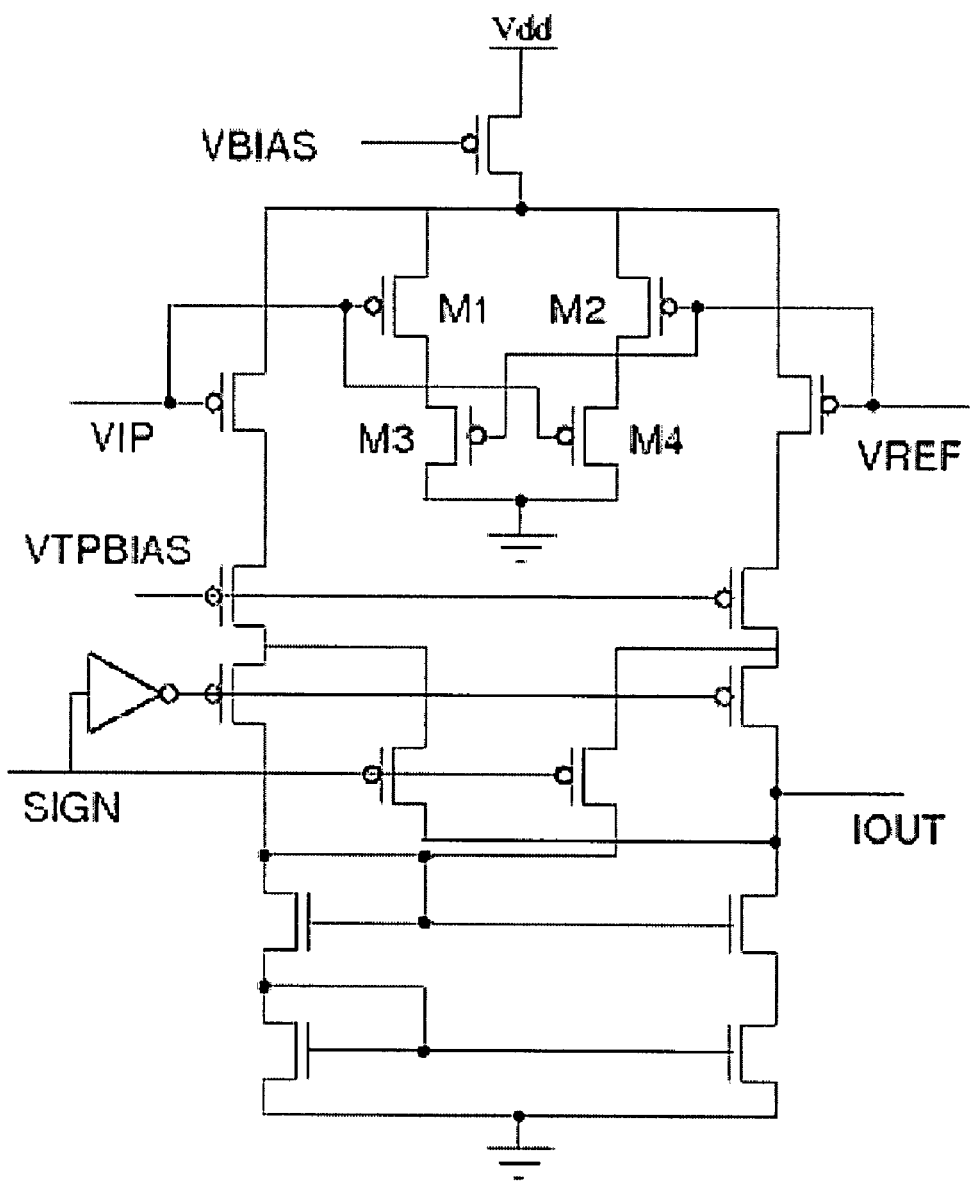
FIG. 11 is a schematic of a symmetric transconductor with bump circuit.

FIG. 11 shows the schematic of the transconductor whose output current is proportional to the product of the differential input signal and the bias current. Precise current summation at the output of the transconductor is achieved by enhancing the output impedance through cascading. A bump circuit acts as a current steering element and improves the performance of the transconductor by enhancing its linear input voltage range. The direction of the output current is digitally controlled based on the SIGN bit which is also the MSB of the incremental/decremental counter.

Figure 12:
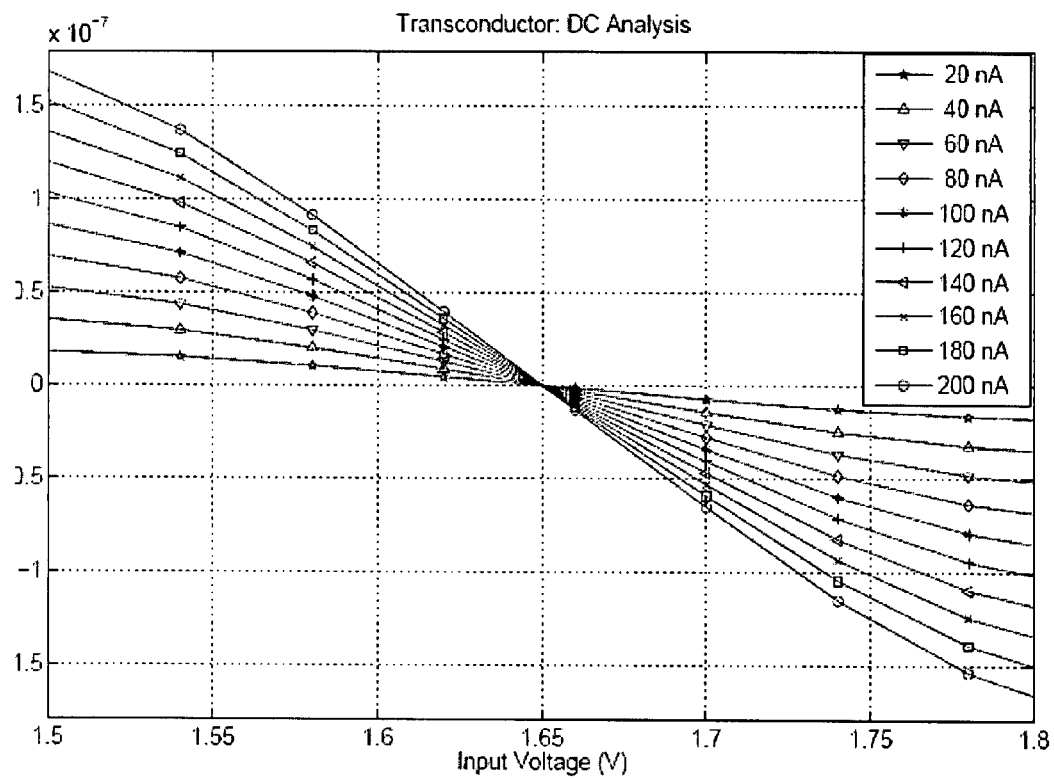
FIG. 12 is a graph illustrating simulated input-output response of the transconductor.
Figure 13:
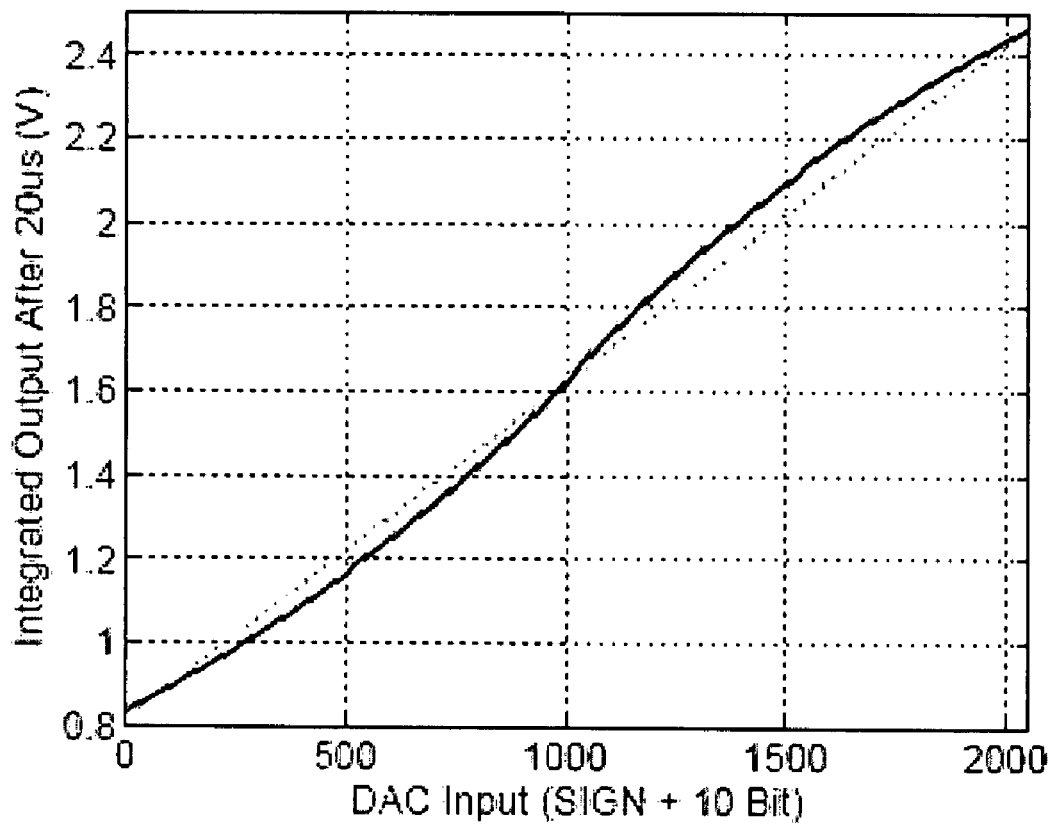
FIG. 13 is a graph illustrating the integrator output when the digital input of the counter is varied.

FIG. 12 shows the response of a transconductor in FIG. 11, that plots the output current versus the input voltage. The plot shows that the transconductor demonstrates a linear input voltage range of more than ±100 mV about the reference voltage. The next set of simulation result shows the response of the transconductor coupled with the current DAC. For stimulation purposes, the output of the transconductor is connected to an integrator which enables measurement of small magnitude currents. FIG. 13 shows the integrator output when the digital input of the counter is varied. It can be seen from the figure that after 1024 counter steps, switching of the SIGN bit leads to reversal of the direction of output current of a transconductor shown in FIG. 11. The reversal of direction of current can be seen as the integrated voltage with respect to reference voltage of 1.65V. The current DAC is sensitive to 10 bit counter data. The DAC response is monotonic but not linear because of transistors coming out of saturation. The non-linearity of DAC do not impose any problem for the MIMO system. The proposed spatio-temporal data converter is robust to such non-linearity of DAC because of its inherent learning mechanism of device mismatches and non-linearities through adaptation and linear transform module. The learning mechanism of the algorithm is shown in MIMO system simulations.

Figure 14:
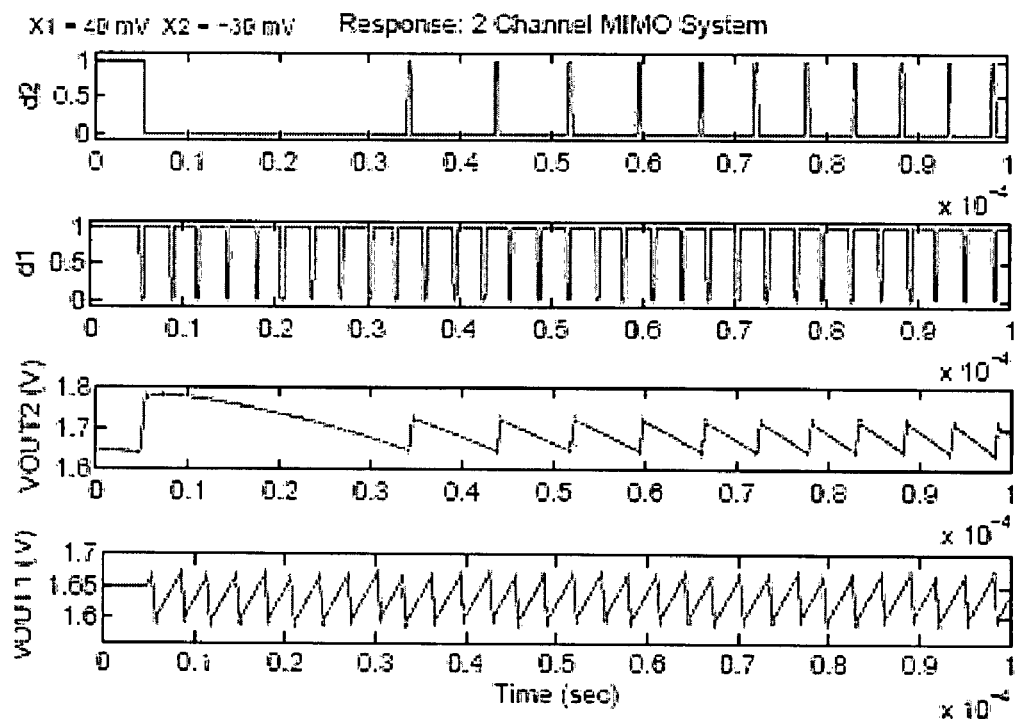
FIG. 14 illustrates the response of 2-channel MIMO analog-to-digital converter during an initial time period.
Figure 15:
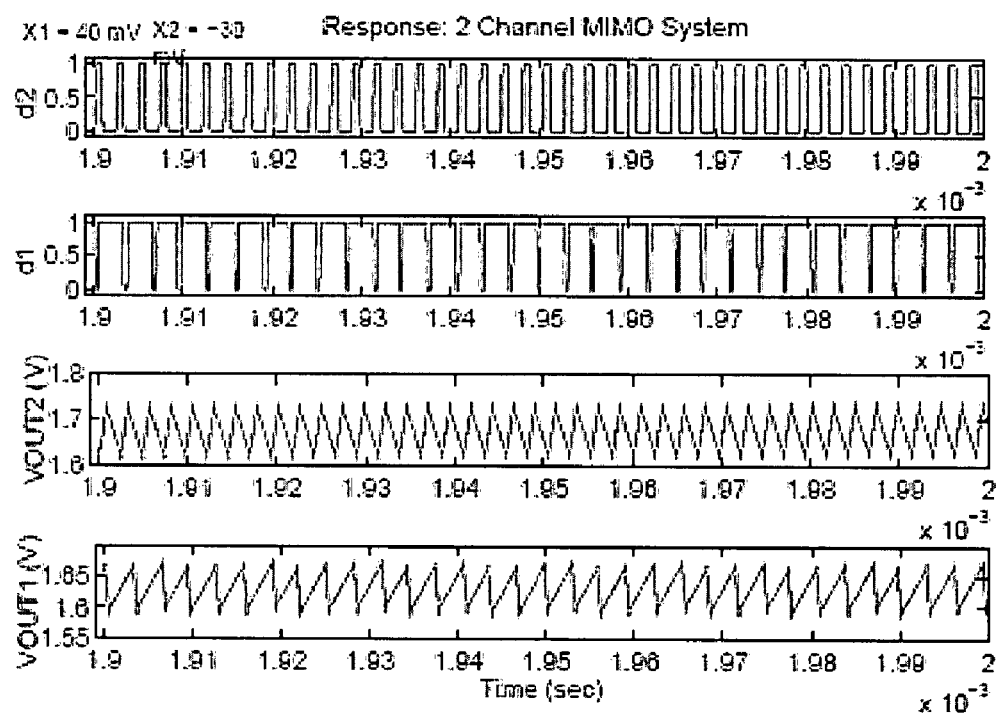
FIG. 15 illustrates the response of 2-channel MIMO analog-to-digital converter after adaptation time.

For clarity of hardware implementation, a 2-dimensional MIMO system is used in this paper. The 2×2 MIMO network shown in FIG. 8 has been verified using SpectreS simulations. The system sampling rate was fixed to 250 KHz. Following the principle of operation of the MIMO converter, the 2×2 MIMO network should cancel the effect of one of the DC voltages, that signifies the redundant information. The operation of 2×2 MIMO network with DC inputs is shown with the help of FIGS. 14 and 15. FIGS. 14 and 15 show the MIMO system performance during the initial 100 us and the final 100 us of the total 2 ms long circuit simulation of the MIMO system. Inputs applied are DC signals where input X1 is +40 mV and input X2 is −30 mV. The digital outputs of two ΣΔ converters d1 and d2 are plotted along with the integrator outputs VOUT1 and VOUT2 respectively. For a 2-dimensional system, channel 1 is a fixed channel therefore output d1 is an equivalent digital output of a signal X1. The input X1 is used to de-correlate the signal X2 from channel 2.

The digital output d1 in FIG. 9 and FIG. 10 shows the constant equivalent digital output. The average value (0.8697) of a digital output d1 is the same during the initial and the final 100 us simulation period. The adaptation of a MIMO system is seen when digital output d2 of a second ΣΔ converter channel changes in the final 100 us simulation period. The gradual change in the integrator output VOUT2 of a second channel is seen in FIGS. 14 and 15. The initial output of the second channel d2 is shown in FIG. 9 where digital output d2 represents digital equivalent of signal X2. The MIMO system learns and adapts according to signal statistics over required number of adaptation cycles. The number of adaptation cycles depends on the signal statistics and device irregularities. In a 2-dimensional MIMO system, the adaptation process can be seen with the help of non-diagonal element of $a_2$, of linear transform matrix A. The non-diagonal element $a_{21}$ of linear transform matrix A changes the current through transconductor $T_2$ (shown in FIG. 8) with the help of current DAC to cancel out the effect of signal X2. After adaptation of the system as seen in FIG. 15, the digital output of d2 is converging to the digital equivalent of zero input signal that represents the de-correlation of signals X2 and X1. The average value of digital output d2 changes from 0.098 to 0.335 in the initial and the final 100 us simulation period that shows the convergence of signal X2 to equivalent zero input signal.

Figure 16:
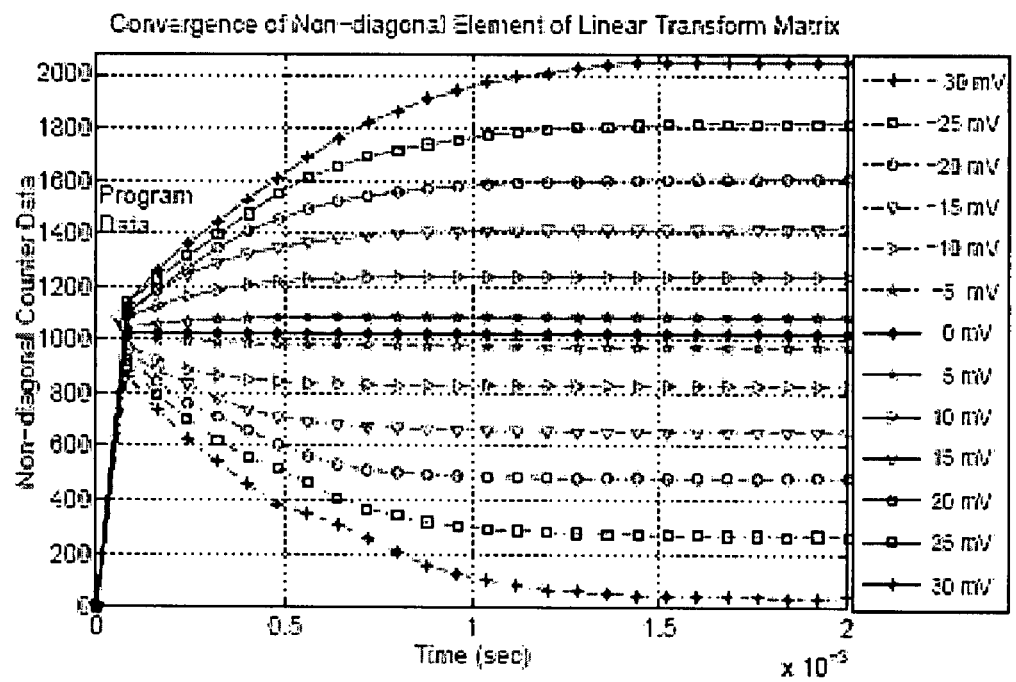
FIG. 16 is a graph illustrating the convergence of linear matrix A to different inputs.

The response of the MIMO system to different DC inputs is shown with the help of convergence of a linear transform matrix. The digital counter value that controls the current DAC of a non-diagonal element of linear transform matrix A is proportional to the correlation (magnitude and the phase difference) of input signals. FIG. 16 shows the steady state counter value of a non diagonal element of a linear transform matrix when one input signal X1 is +40 mV and signal X2 is varied in parametrical steps of 5 mV. The steady state adaptation response is shown in FIG. 16 for DC inputs.

Figure 17:
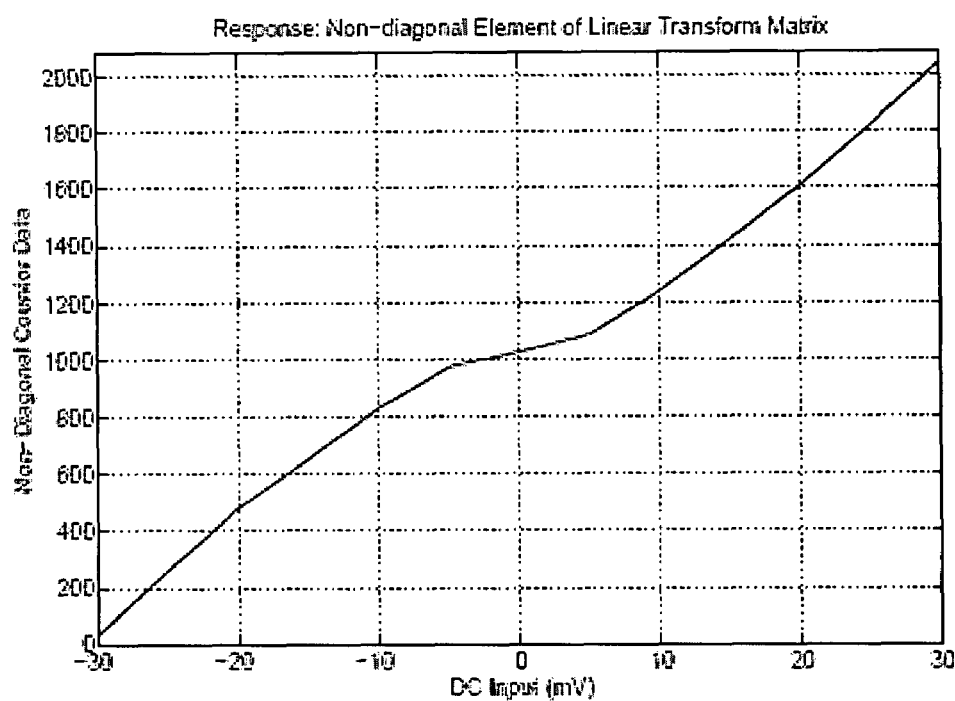
FIG. 17 is a graph illustrating the response of the MIMO analog-to-digital converter to current non-linearity.
Figure 18:
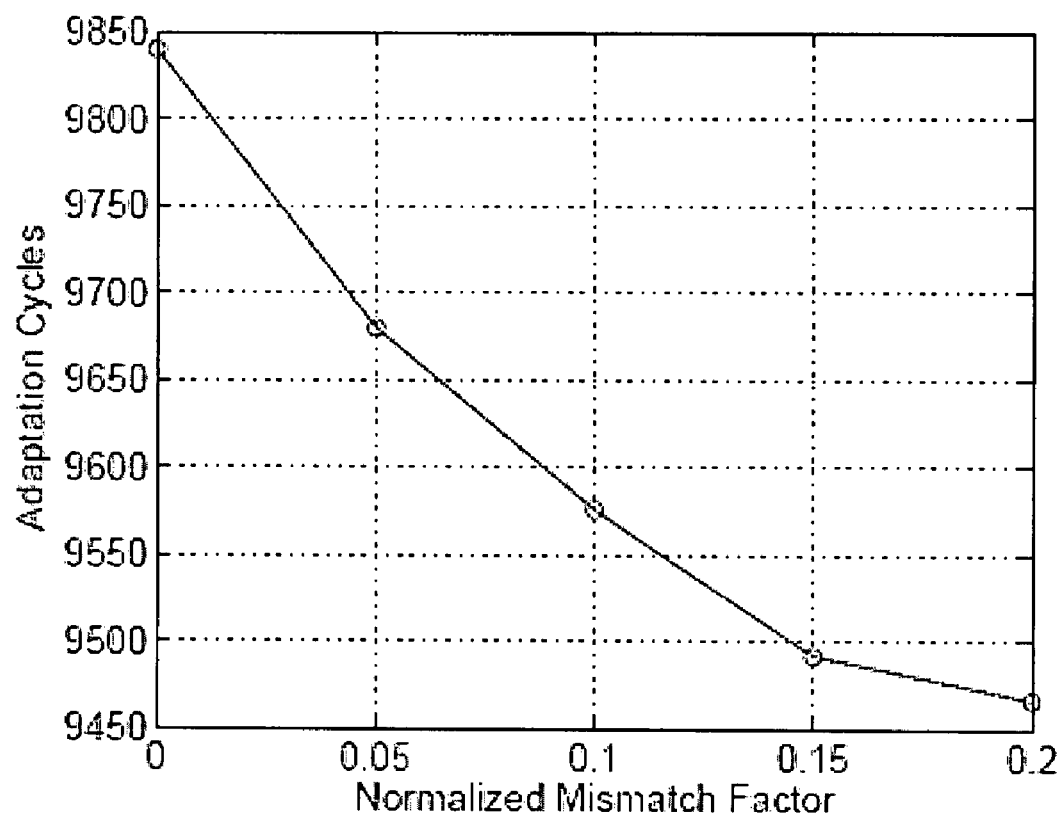
FIGS. 18-23 are graphs illustrating the response of 2-channel MIMO analog-to-digital converter to sine wave inputs.
Figure 19:
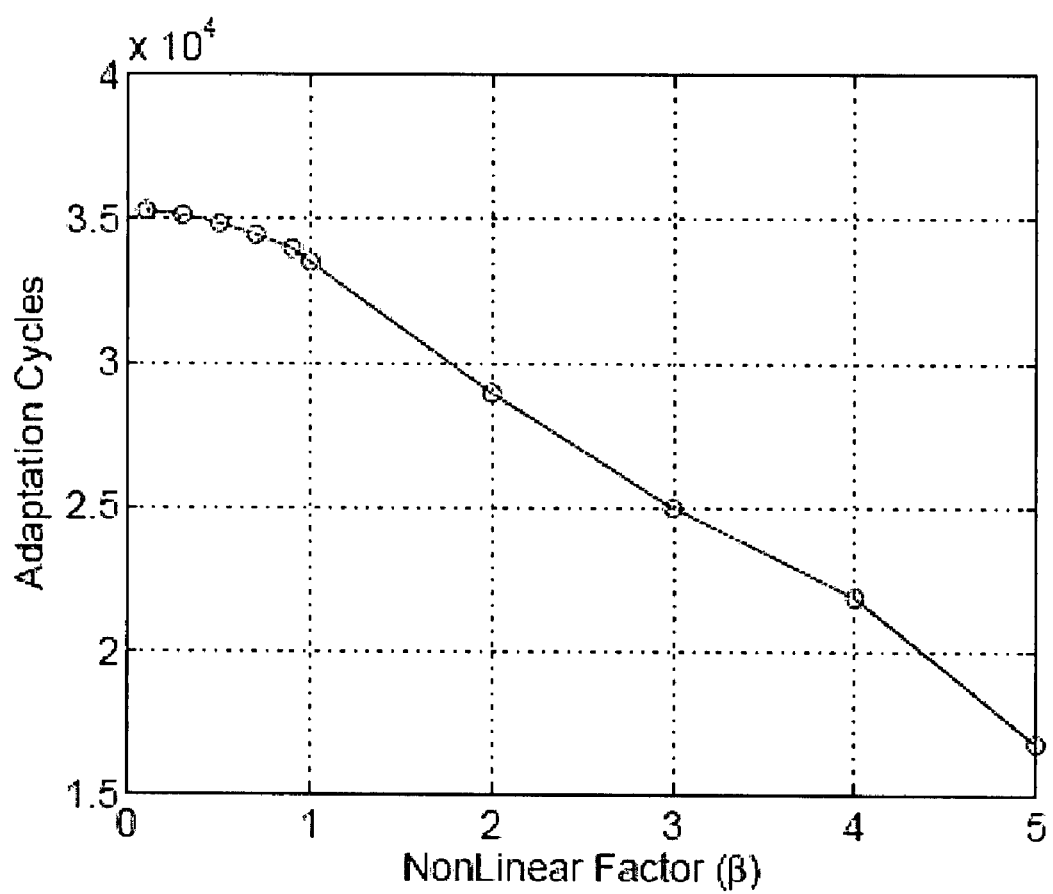
Figure 20:
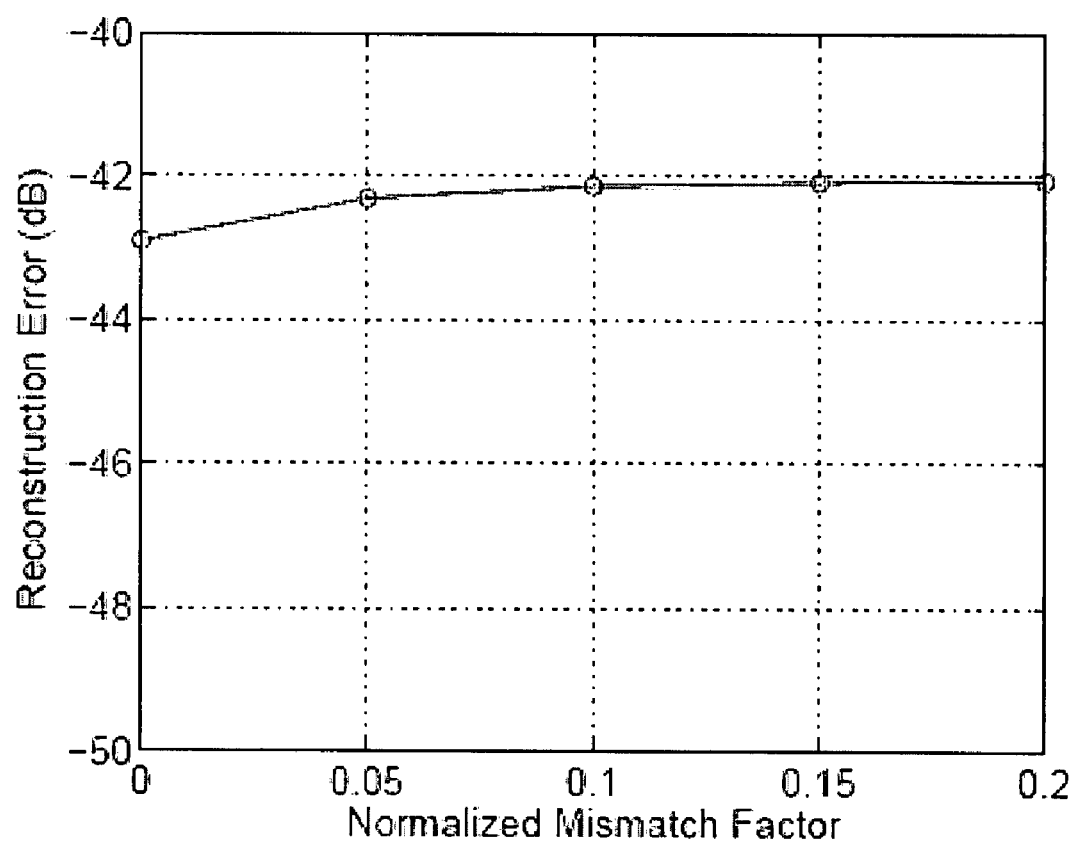
Figure 21:
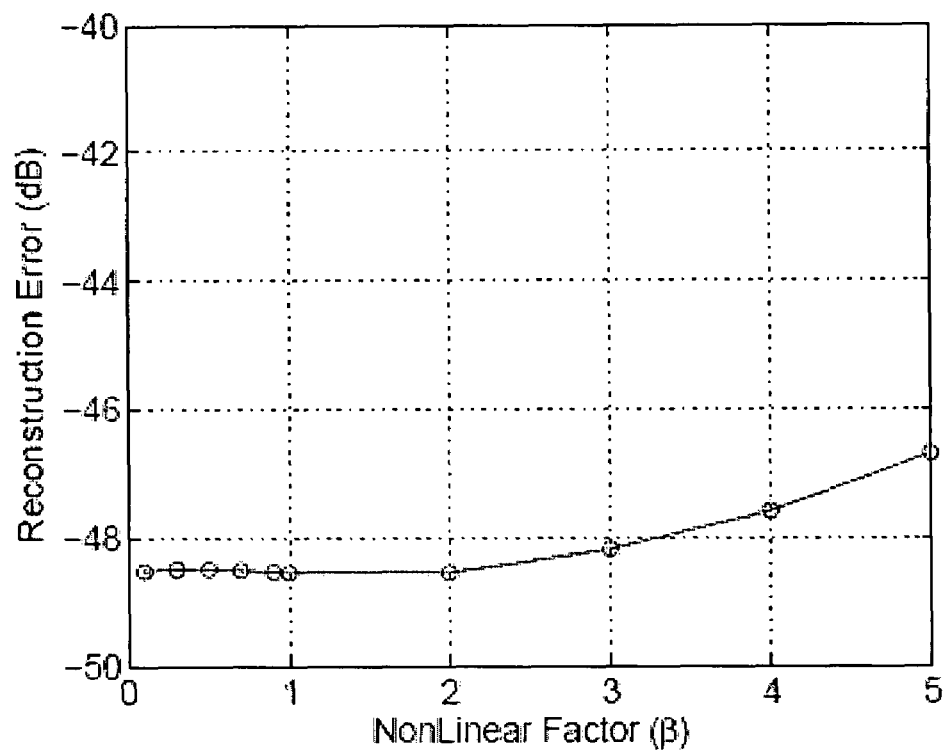
Figure 22:
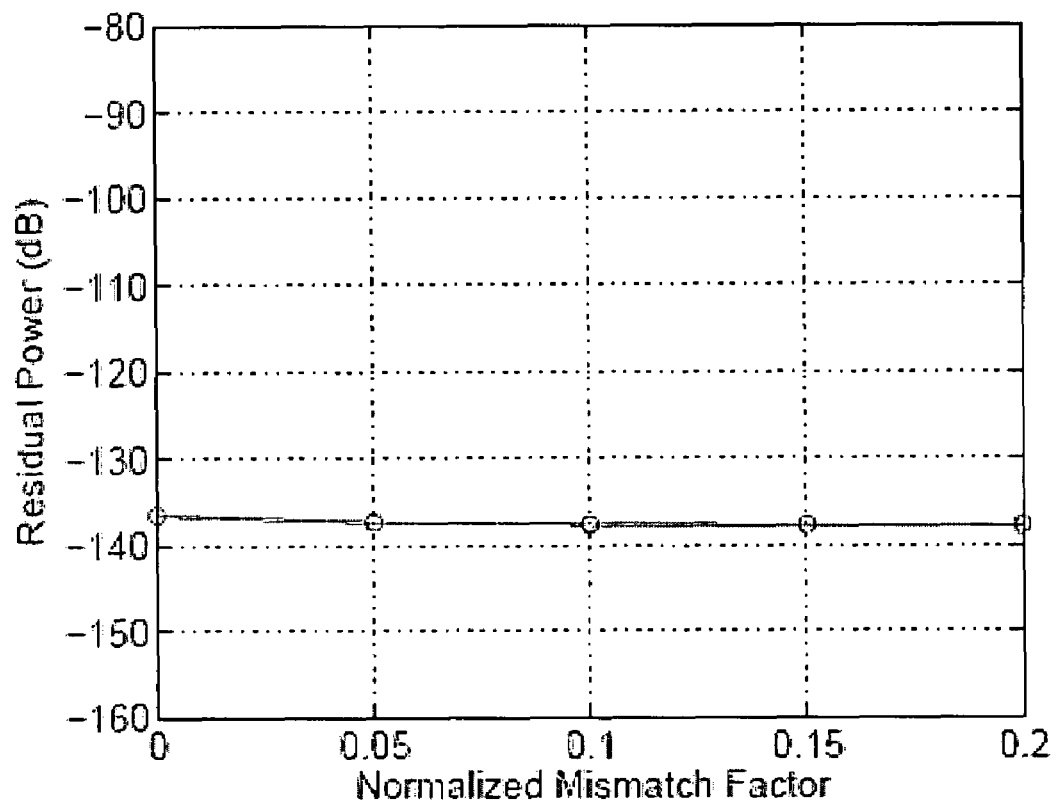

The most interesting feature of the MIMO system is its adaptation and self correcting process with respect to hardware irregularities and non linearities in the system. The current DAC response is monotonic but non-linear as shown in FIG. 13. The learning of device mismatches and non-linearities for adaptation is carried out through the update mechanism of linear transform matrix. The response of the MIMO system to the current DAC non-linearity is shown in FIG. 17. The linear transform matrix responds to the non-linear DAC by updating the counter value that controls the DAC current to perform signal de-correlation as shown in FIG. 17. The FIG. 16 shows the convergence if linear transform matrix when one input signal X1 is +40 mV and signal X2 is varied in parametrical steps of 5 mV as shown in FIG. 17.

Figure 23:
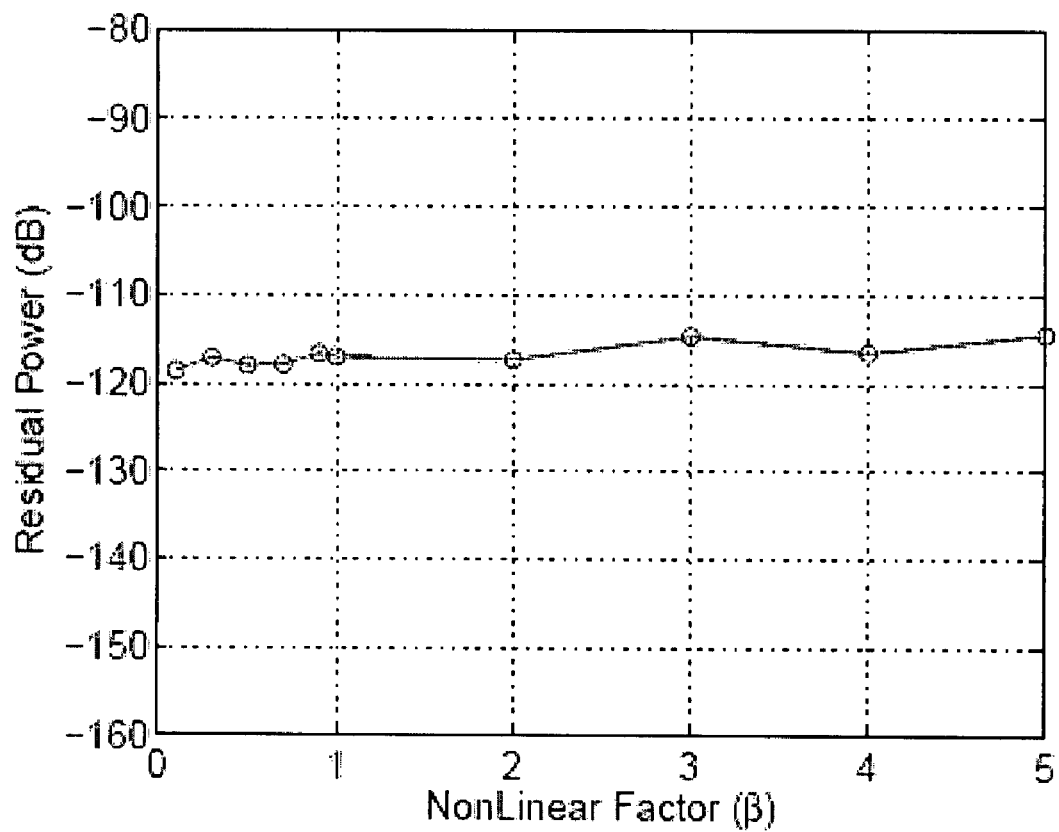

For sinusoidal inputs shown in FIG. 23, the adaptation process will be slower because of change in signal statistics with respect to time. In this case, the MIMO system track the correlation of 2 signals X1 and X2 where signal magnitudes and phases are changing with respect to time. Therefore, learning process is slow. It can be seen that the non-diagonal element of linear transform matrix A is slowly adapting to cancel out any redundancy in the signal X2 to make the output data at channel 2 un-correlated.

In this disclosure a MIMO analog-to-digital conversion algorithm was presented with application to multi-channel neural prosthesis as well as other multi-channel applications. The roots of the algorithm lie within the framework of large margin principles, where the data converter maximizes the relative distance between signal space corresponding to different channels. Experimental results with real multi-channel neural data demonstrate the effectiveness of the proposed method in eliminating cross-channel redundancy and hence reducing data throughput and power dissipation requirements of a multi-channel biotelemetry sensor. The following description is merely exemplary in nature and is not intended to limit the present disclosure, application, or uses.

What is claimed is:

1. A method for multi-channel analog-to-digital conversion, comprising:
   receiving an input vector which represents a plurality of analog signals;
   transforming the input vector using a linear transformation matrix;
   converting the transformed input vector to a digital stream using an array of sigma-delta converter; and
   adapting the linear transform matrix to maximize de-correlation between the signals represented in the input vector.

2. The method of claim 1 further comprises receiving another input vector representing the plurality of analog signals and transforming the another input vector using the adapted linear transform matrix.

3. The method of claim 1 further comprises using a min-max optimization criterion to obtain the array of sigma-delta converters and updating the linear transform matrix.

4. The method of claim 1 further comprises transforming the input vector using a lower triangular matrix.

5. The method of claim 1 further comprises selecting a signal having the largest signal power from among the plurality of analog signals as a reference signal in the transformation step.

6. The method of claim 1 wherein the transformed input vector is converted in accordance with $$w[n]=w[n-1]+\eta(Ax-d[n])$$

where x is the input vector, A is the linear transform matrix, $d[n]=\text{sgn}(w[n-1])$ and $\text{sgn}(u)$ denotes an element-wise signum operation.

7. The method of claim 1 wherein adapting the linear transform matrix further comprises applying an updating rule that follows on a gradient ascent.

8. The method of claim 6 wherein adapting the linear transform matrix comprises updating the matrix in accordance with $$a_{ij}[n]=a_{ij}[n-1]-\epsilon d_i[n]\text{sign}(x_j); \forall i>j$$

where x is the input vector and $\epsilon$ is a learning rate parameter.

9. An analog-to-digital converter, comprising:
   a matrix vector multiplier adapted to receive an input vector presenting a plurality of analog signals and operable to transform the input vector to an output signal in accordance with a linear transform matrix;
   an array of sigma-delta converters adapted to receive the output signal and convert the output signal to a digital sequence vector; and
   an adapter configured to receive the input vector and the digital sequence vector, and operable to adapt the linear transform matrix to maximize separation between the signals represented in the input vector.

10. The converter of claim 9 wherein the matrix vector multiplier is implemented using a network of transconductors.

11. The converter of claim 9 wherein the linear transform matrix is further defined as a lower triangular matrix.

12. The converter of claim 9 wherein the adapter is implemented by analog circuitry as an incremental/decremental counter.

13. The converter of claim 9 wherein the array of sigma-delta converters convert the transformed input vector in accordance with $$w[n]=w[n-1]+\eta(Ax-d[n])$$

where x is the input vector, A is the linear transform matrix, $d[n]=\text{sgn}(w[n-1])$ and sgn(u) denotes an element-wise signum operation.

14. The converter of claim 9 wherein the adapter applies an updating rule that follows on a gradient ascent.

15. The method of claim 13 wherein the adapter updates the linear transform matrix in accordance with $$a_{ij}[n]=a_{ij}[n-1]-\epsilon d_i[n]\text{sign}(x_j); \forall i>j$$

where x is the input vector and $\epsilon$ is a learning rate parameter.

* * * * *

UNITED STATES PATENT AND TRADEMARK OFFICE
CERTIFICATE OF CORRECTION

PATENT NO. : 7,479,911 B2
APPLICATION NO. : 11/895630
DATED : January 20, 2009
INVENTOR(S) : Shantanu Chakrabartty Page 1 of 1

It is certified that error appears in the above-identified patent and that said Letters Patent is hereby corrected as shown below:

Column 4, line 3, "$\leq$" should be on the line and not a subscript.

Column 4, line 64, "i<j" should be --i>j--.

Column 5, line 10, "i<j" should be --i>j--.

Column 9, line 23, "$a_2$" should be --$a_{21}$--.

Column 9, line 25, "$T_2$" should be --$T_{21}$--.

Signed and Sealed this

Nineteenth Day of May, 2009

JOHN DOLL
*Acting Director of the United States Patent and Trademark Office*